US009470770B2

(12) United States Patent
Yang (10) Patent No.: US 9,470,770 B2
(45) Date of Patent: Oct. 18, 2016

(54) MAGNETIC RESONANCE SPECTROSCOPY WITH AUTOMATIC PHASE AND B0 CORRECTION USING INTERLEAVED WATER REFERENCE SCAN (75) Inventor: Baolian Yang, Highland Heights, OH (US)

(73) Assignee: Koninklijke Philips N.V., Eindhoven (NL)

(*) Notice: Subject to any disclaimer, the term of this patent is extended or adjusted under 35 U.S.C. 154(b) by 588 days.

(21) Appl. No.: 13/985,066

(22) PCT Filed: Feb. 10, 2012

(86) PCT No.: PCT/IB2012/050602
§ 371 (c)(1),
(2), (4) Date: Aug. 13, 2013

(87) PCT Pub. No.: WO2012/110927
PCT Pub. Date: Aug. 23, 2012

(65) Prior Publication Data
US 2013/0320979 A1 Dec. 5, 2013

Related U.S. Application Data (60) Provisional application No. 61/442,963, filed on Feb. 15, 2011.

(51) Int. Cl.
G01R 33/44 (2006.01)
G01R 33/483 (2006.01)
(Continued)

(52) U.S. Cl.
CPC .......... *G01R 33/443* (2013.01); *G01R 33/485* (2013.01); *G01R 33/4838* (2013.01); *G01R 33/56563* (2013.01); *G01R 33/4625* (2013.01); *G01R 33/5607* (2013.01)

(58) Field of Classification Search
CPC .............. G01R 33/443; G01R 33/485; G01R 33/56563; G01R 33/4838; G01R 33/5607; G01R 33/4625
See application file for complete search history.

(56) References Cited

U.S. PATENT DOCUMENTS 5,159,550 A * 10/1992 Sakamoto ........ G01R 33/56509
324/307
6,583,623 B1 6/2003 Kwok
(Continued)

FOREIGN PATENT DOCUMENTS

WO 2005106522 A1 11/2005

OTHER PUBLICATIONS

Willcott, M.R. et al "Magnetic Field Mapping in NMR Imaging", Magnetic Resonance Imaging, vol. 5, 1987, pp. 301-306.
(Continued)

Primary Examiner — David Gray
Assistant Examiner — Laura Roth (57) ABSTRACT

A magnetic resonance (MR) sequence (14) is performed, including: applying a preparatory MR sub-sequence (S prep) providing water signal suppression; performing a magnetic resonance spectroscopy (MRS) sub-sequence (S MRS) after applying the preparatory MR sub-sequence to acquire H MRS data with water signal suppression; and performing an MR reference sub-sequence (S Ref) to acquire MR reference data. The MR reference sub-sequence is performed after the MRS sub-sequence. Phase and B0 correction of the H MRS data with water signal suppression are performed using the MR reference data to generate corrected MRS data. The excitation pulse (g) of the MR reference sub-sequence has a flip angle of less than or equal to o, and more preferably has a flip angle of less than or equal to 3 o. In some embodiments the MR sequence has a total repetition time (TR) of 2000 msec or less.

20 Claims, 5 Drawing Sheets (51) Int. Cl.
*G01R 33/485* (2006.01)
*G01R 33/565* (2006.01)
G01R 33/46 (2006.01)
G01R 33/56 (2006.01)

(56) References Cited

U.S. PATENT DOCUMENTS

| | | | |
|---|---|---|---|
| 6,900,634 B2 | 5/2005 | Roell | |
| 7,417,430 B2* | 8/2008 | Aldefeld | G01R 33/56375 324/307 |
| 2004/0005273 A1* | 1/2004 | Driehuys | A61B 5/055 424/9.3 |
| 2004/0135578 A1* | 7/2004 | Peters | G01R 33/56554 324/309 |
| 2006/0106299 A1* | 5/2006 | Uchizono | G01R 33/3415 600/410 |
| 2007/0247154 A1 | 10/2007 | McKenzie | |
| 2008/0116893 A1* | 5/2008 | Petersson | G01R 33/446 324/318 |
| 2010/0085050 A1 | 4/2010 | Dong | |
| 2010/0244823 A1 | 9/2010 | Abe | |

OTHER PUBLICATIONS

Eslami, Ramin et al "Correction of B0 Inhomogeneity Distortion in Magnetic Resonance Spectroscopic Imaging", Acoustics, Speech and Sginal Processing, 2009, p. 405-408.

Maudsley, A.A. et al "Field Inhomogeneity Correction and Data Processing for Spectroscopic Imaging", Magnetic Resonance in Medicine, vol. 2, 1985, pp. 218-233.

Cheng, Yu-Che et al "A Post-Processing Method for Correction and Enhancement of Chemical Shift Images", Sciencedirect, Magnetic Resonance Imaging, vol. 27, 2009, pp. 1420-1429.

Van Der Veen, Jan Willem C. et al "Proton MR Spectroscopic Imaging without Water Suppression", Radiology, vol. 217, No. 1, 2000, pp. 296-300.

Maudsley, Andrew A. et al, "Automated Processing for Proton Spectroscopic Imaging using Water Reference Deconvolution", Magnetic Resonance in Medicine, vol. 31, 1994, pp. 589-595.

* cited by examiner

MAGNETIC RESONANCE SPECTROSCOPY WITH AUTOMATIC PHASE AND B0 CORRECTION USING INTERLEAVED WATER REFERENCE SCAN

CROSS-REFERENCE TO PRIOR APPLICATIONS

This application is the U.S. National Phase application under 35 U.S.C. §371 of International Application No. PCT/IB2012/050602, filed on Feb. 10, 2012, which claims the benefit of U.S. Provisional Patent Application No. 61/442,963, filed on Feb. 15, 2011. These applications are hereby incorporated by reference herein.

The following relates to the magnetic resonance arts, magnetic resonance spectroscopy arts, magnetic resonance imaging arts, medical imaging arts, and related arts.

Magnetic resonance (MR) is a known technique that is useful in medical diagnostics, veterinary work, forensic sciences, archaeology, and so forth. Most commonly, an MR image is generated by exciting, spatially encoding, and reading out the $^1H$ magnetic resonance signal. More information can be obtained by magnetic resonance spectroscopy (MRS), in which the spectrum of the MR response is acquired and analyzed. For example, the $^1H$ MR signal can be resolved by MRS to distinguish a number of different constituent signals emanating from hydrogen in different chemical environments, such as water ($H_2O$), fat, tissue, or other hydrocarbons, or so forth. MRS can be performed at a single location (termed "single voxel spectroscopy" or SV), or can be acquired for a grid of voxels to produce (with suitable data processing) an image (termed "magnetic resonance spectroscopic imaging" or MRSI). As used herein, the term "magnetic resonance spectroscopy" or MRS encompasses both MRSI and SV.

In most common MR subjects, such as human or animal subjects, the water signal is the dominant component of the $^1H$ spectrum. To accurately measure portions of the $^1H$ spectrum other than the water peak, it is known to suppress the water signal prior to data acquisition using a suitable water suppression pulse or pulse sequence. The resulting water-suppressed $^1H$ spectrum is weak and can be distorted by artifacts such phase distortion and/or B0 field drift. To perform phase and B0 correction and thus obtain more accurate MRS spectra, it is known to acquire an additional $^1H$ signal in which the water signal is not suppressed. This additional non-water suppressed signal includes an unsuppressed water component and hence is much stronger than the water-suppressed signal. Accordingly, the non-water suppressed signal suitably serves as a reference scan for performing phase and B0 correction.

A problem with this approach is that the extra non-water suppressed scan substantially increases the total scan time. Moreover, because the water reference signal and the MRS signal are generated by different scans, the reference (non-water suppressed) signal may have different phase distortion and/or B0 drift as compared with the MRS signal due to system instability, which can degrade the effectiveness of the phase and/or B0 correction. The total repetition time (TR) for the combination of the MRS scan and the reference scan is typically at least 3000 msec (where "msec" denotes "milliseconds") which provides substantial time for system instability to introduce problems.

The following provides new and improved apparatuses and methods as disclosed herein.

In accordance with one disclosed aspect, a magnetic resonance (MR) sequence is performed, including: applying a preparatory MR sub-sequence providing water signal suppression; performing a magnetic resonance spectroscopy (MRS) sub-sequence after applying the preparatory MR sub-sequence to acquire $^1H$ MRS data with water signal suppression; and performing an MR reference sub-sequence after the MRS sub-sequence to acquire MR reference data wherein the excitation pulse for the MR reference sub-sequence has a flip angle of 5° or less. Phase and B0 correction of the $^1H$ MRS data with water signal suppression are performed using the MR reference data to generate corrected MRS data. In some embodiments the combination of the MRS sub-sequence and the MR reference sub-sequence is performed over a time interval less than or equal to 1000 msec. In some embodiments no time delay is interposed between the end of the MRS sub-sequence and the excitation pulse of the MR reference sub-sequence.

In accordance with another disclosed aspect, an apparatus comprises a magnetic resonance (MR) controller configured to cause an MR scanner to perform an MR sequence including: applying a preparatory MR sub-sequence providing water signal suppression; performing a magnetic resonance spectroscopy (MRS) sub-sequence after applying the preparatory MR sub-sequence to acquire MRS data with water signal suppression; and performing an MR reference sub-sequence after the MRS sub-sequence to acquire MR reference data. The MR sequence has a repetition time (TR) of 2000 msec or less. In some embodiments the excitation pulse of the MR reference sub-sequence has a flip angle of 5° or less. In some embodiments the excitation pulse of the MR reference sub-sequence has a flip angle of 3° or less. In some embodiments the apparatus further comprises an MRS data processing module configured to perform phase and B0 correction of the MRS data with water signal suppression using the MR reference data to generate corrected MRS data.

In accordance with another disclosed aspect, a storage medium stores instructions executable by a digital processor to cause a magnetic resonance (MR) scanner to perform an MR sequence including: applying a preparatory MR sub-sequence providing suppression of MR signal from a dominant signal source; performing a magnetic resonance spectroscopy (MRS) sub-sequence after applying the preparatory MR sub-sequence to acquire MRS data with suppression of MR signal from the dominant signal source; and performing an MR reference sub-sequence to acquire MR reference data. The MR reference sub-sequence is performed after the MRS sub-sequence and while the preparatory MR sub-sequence continues to provide some suppression of MR signal from the dominant signal source. An excitation pulse of the MR reference sub-sequence has a flip angle of 5° or less, and more preferably has a flip angle of 3° or less. In illustrative embodiments set forth herein, the dominant signal source is water.

One advantage resides in faster MRS acquisition, with $^1H$ MRS acquisitions having total repetition time (TR) of 1500-2000 msec being readily achievable.

Another advantage resides in more accurate phase and B0 correction of MRS spectra using a non-water suppressed water signal.

Further advantages will be apparent to those of ordinary skill in the art upon reading and understanding the following detailed description.

Figure 1:
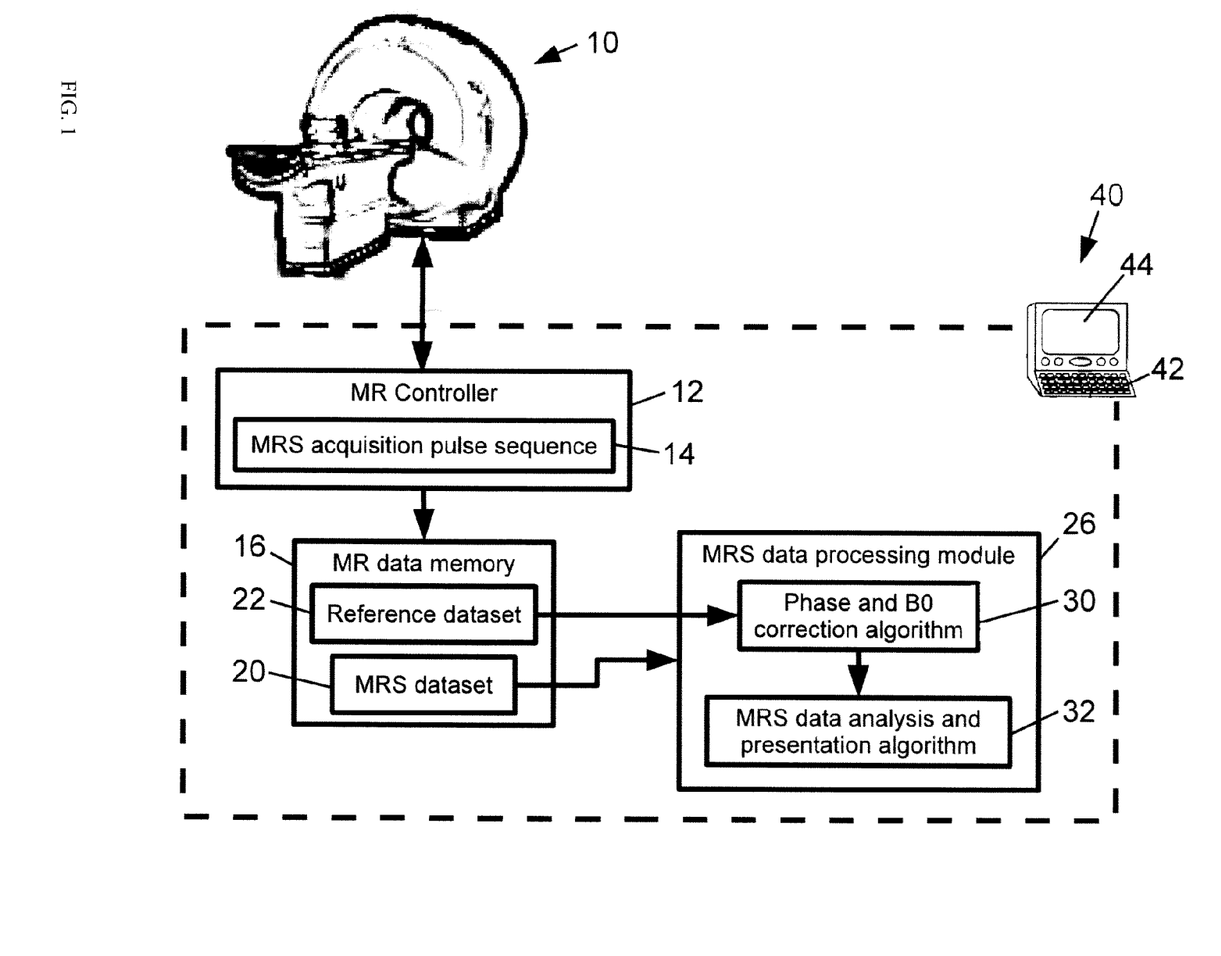
FIG. 1 diagrammatically shows a magnetic resonance (MR) system configured to perform magnetic resonance spectroscopy (MRS) as disclosed herein.

With reference to FIG. 1, a magnetic resonance system includes a magnetic resonance (MR) scanner 10, such as an illustrated Achieva™ MR scanner (available from Koninklijke Philips Electronics N.V., Eindhoven, The Netherlands), or an Intera™ or Panorama™ MR scanner (both also available from Koninklijke Philips Electronics N.V.), or another commercially available MR scanner, or a non-commercial MR scanner, or so forth. In a typical embodiment, the MR scanner includes internal components (not illustrated) such as a superconducting or resistive main magnet generating a static ($B_0$) magnetic field, sets of magnetic field gradient coil windings for superimposing selected magnetic field gradients on the static magnetic field, a radio frequency excitation system for generating a radio frequency ($B_1$) field at a frequency selected to excite magnetic resonance (typically $^1H$ magnetic resonance, although excitation of another magnetic resonance nuclei or of multiple magnetic resonance nuclei is also contemplated), and a radio frequency receive system including a radio frequency receive coil array, or a plurality of receive coils, for detecting magnetic resonance signals emitted from the subject. With continuing reference to FIG. 1 and with further reference to FIG. 2, the MR scanner 10 operates under control of a magnetic resonance (MR) control module 12 to perform magnetic resonance spectroscopy (MRS) using an MRS pulse sequence 14 that includes a preparatory portion $S_{prep}$, an MRS sub-sequence $S_{MRS}$, and an interleaved navigator comprising a reference sub-sequence $S_{Ref}$. The MRS pulse sequence 14 is suitably used for MR spectroscopic imaging (MRSI) or for single voxel (SV) acquisition. An MR data memory 16 accumulates data acquired by the MRS acquisition sub-sequence $S_{MRS}$ as an MRS dataset 20, and accumulates data acquired by the reference sub-sequence $S_{Ref}$ as a reference dataset 22. An MRS data processing module 26 processes the datasets 20, 22 to produce useful information. The MRS data processing module 26 implements a phase and B0 correction algorithm 30 that corrects the MRS dataset 20 using the reference dataset 22, and the corrected MRS data are analyzed and/or presented by an MRS data analysis and presentation algorithm 32 implemented by the MRS data processing module 26. The data presentation can take various forms, such as plotting the MRS spectrum for a voxel as a function of frequency (or wavenumber or another spectral metric), displaying an image whose pixel or voxel intensities correspond to a peak value of an MRS spectrum peak of interest, plotting the peak value of an MRS spectrum peak of interest for a single voxel over time so as to extract functional information, or so forth.

The various computational and memory components 12, 16, 26 are suitably embodied by an illustrative computer 40 or other digital processing device employing a multi-core processor or other parallel processor, a single-core processor, a graphical processing unit, i.e. GPU, or so forth and having a communication bus or other operative connection with the MR scanner 10 to cause the MR scanner 10 to perform the MRS data acquisition. While the digital processing device employs a digital processor, it is also contemplated for the digital processing device to include or have access to some analog circuitry, such as analog or hybrid digital/analog application-specific integrated circuitry (ASIC). The disclosed MRS techniques may also be embodied as a storage medium storing instructions that when executed by a processor of the digital processing device 40 perform the disclosed operations. For example, the storage medium may comprise a hard drive, optical drive, random access memory (RAM), FLASH memory, or other electrostatic memory, various combinations thereof, or another suitable storage medium. These types of storage media may also be used as the MR data memory 16. Indeed, in some embodiments a common storage medium (e.g., a hard disk drive of the computer) may both embody the MR data memory 16 and also store the instructions that when executed by a processor of the digital processing device 40 perform the disclosed operations.

The MR system typically also includes an illustrative keyboard 42 or other user input device (e.g., a mouse, trackball, or other pointing device) via which a user inputs commands, parameters, or so forth for initiating and controlling the MRS acquisition, data processing, and/or data presentation. MRS spectra, MRSI images, or other MRS data presentation output by the MRS data processing module 26 are suitably displayed on a display device such as an illustrative display device 44 of the illustrative computer 40. Although the various processing components 12, 26, data memory 16, and user interfacing components 42, 44 are illustrated as integrated or combined into the single illustrative computer 40, it is to be understood that these various components and/or memory may instead be variously embodied by different computers, network servers, Internet-based processors, components of a cloud computing network, or so forth.

The MRS pulse sequence 14 is shown as integrated with the MR controller 12. For example, the MRS pulse sequence 14 may be stored in a memory or storage medium of the MR controller 12. In an alternative approach, the MRS pulse sequence 14 may be stored on a storage medium that is distinct from, but in operative communication with, the MR controller 12. The MRS pulse sequence 14 may be stored as instructions executed by the MR controller 12, or as data that is operated upon by the MR controller 12. As an example of the latter, each pulse may be represented in the MRS pulse sequence 14 by a source (e.g., radio frequency coil, magnetic field gradient coil, or other generator) and pulse parameters such as pulse amplitude, duration, frequency, or so forth.

Figure 2:
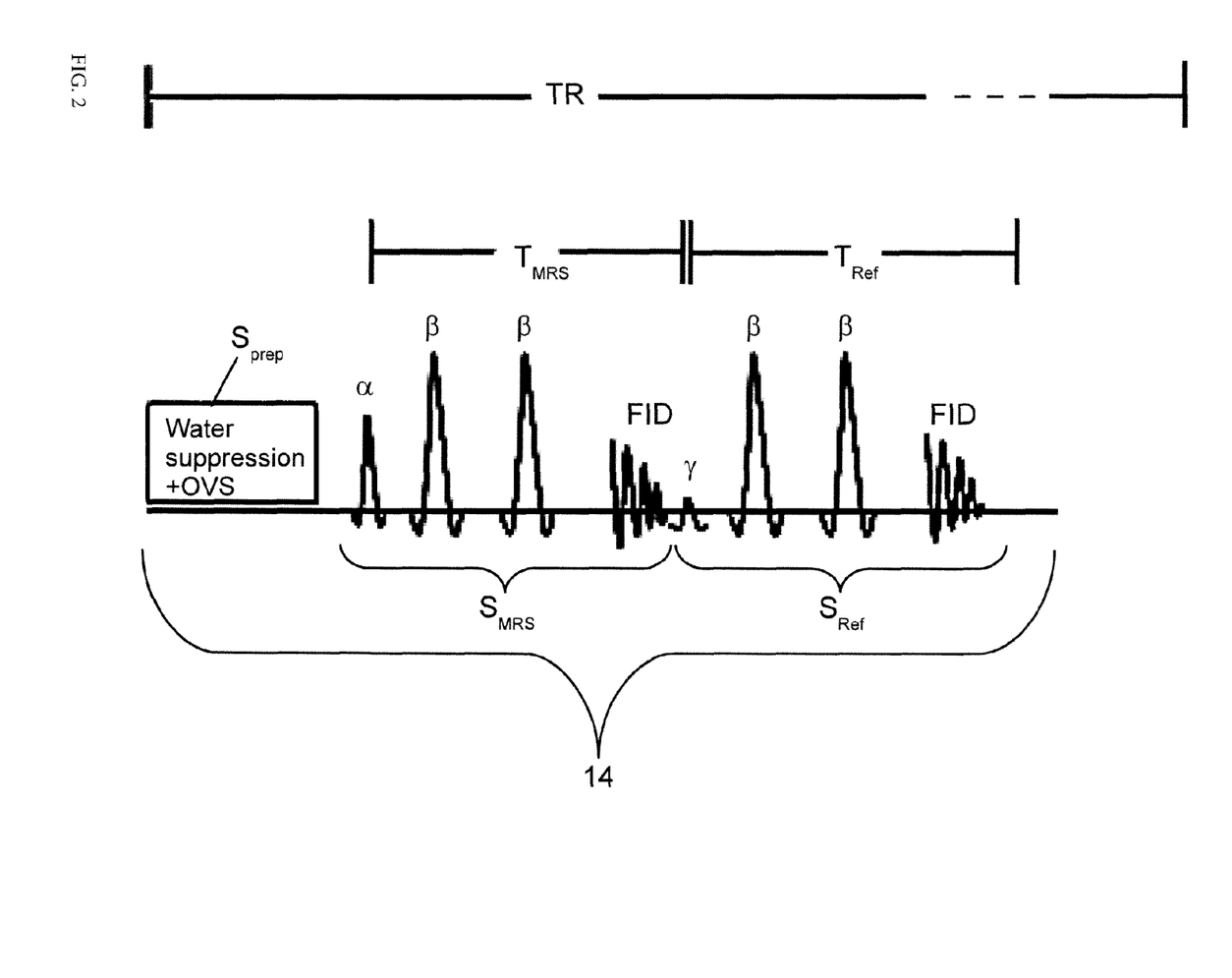
FIG. 2 diagrammatically shows a pulse sequence diagram for the MRS acquisition sequence employed by the MR system of FIG. 1.

With returning reference to FIG. 2, the illustrative MRS pulse sequence 14 is described in additional detail. It is to be understood that FIG. 2 shows a diagrammatic representation of the MRS pulse sequence 14 including salient features described herein. The MRS pulse sequence 14 may include additional or other pulses that are not illustrated in FIG. 2. For example, when used in an MRSI acquisition the MRS pulse sequence 14 typically includes suitable spatial encoding magnetic field gradient pulses that are not shown in FIG. 2.

The preparatory MR sub-sequence $S_{prep}$ provides water signal suppression and optionally other functionality. For example, the illustrative MR sub-sequence $S_{prep}$ includes water suppression pulses and/or out-volume suppress (OVS) pulses. The MRS sub-sequence $S_{MRS}$ can employ substantially any magnetic resonance spectroscopy acquisition sequence, and can be volume or slice selective with PRESS or STEAM technology. The illustrative MRS sub-sequence $S_{MRS}$ includes an excitation pulse (α) and two refocusing pulses (β) followed by data acquisition during free induction decay (FID) of the excited MR signal. The duration of the MRS sub-sequence $S_{MRS}$ is denoted herein as $T_{MRS}$. The MR reference sub-sequence $S_{Ref}$ is suitably a repetition of the MRS subsequence but with a low flip-angle excitation pulse (denoted herein as γ). In some embodiments γ is less than or equal to 5°. In some embodiments γ is less than or equal to 3°. The duration of the MR reference sub-sequence $S_{Ref}$ is denoted herein as $T_{Ref}$. This time interval can be made short, e.g. $T_{Ref} \leq 500$ msec.

The disclosed MR sequence for MRS data acquisition takes advantage of certain observations made herein. One observation is that the MRS (sub-)sequence $S_{MRS}$ is of short duration in terms of acquisition, but has a long repetition time (TR) in order for the water suppression to recover. For example, in some embodiments the MRS sub-sequence $S_{MRS}$ has a duration ($T_{MRS}$) of 500 msec or less, and more preferably has a duration of 300 msec or less. On the other hand, TR is typically about 2000 msec, and in some embodiments is 1500 msec or shorter. This means there is a long "dead" time between the useful end of the MRS acquisition and its next repetition. In the MRS sequence 14, a portion of this "dead" time is used to acquire the MR reference sub-sequence $S_{Ref}$.

Another observation made herein is that the reference signal for phase and B0 correction of MRS data does not require a full-strength water signal. Thus, the MR reference sub-sequence $S_{Ref}$ is suitably performed after the MRS sub-sequence $S_{MRS}$ with minimal delay between the sub-sequences $S_{MRS}$ and $S_{Ref}$. Thus, in some embodiments no time delay is interposed between the end of the MRS sub-sequence $S_{MRS}$ and the excitation pulse γ of the MR reference sub-sequence $S_{Ref}$. The delay between the end of the MRS sub-sequence $S_{MRS}$ and the start of the MR reference sub-sequence $S_{Ref}$ is preferably minimized since (as recognized herein) the water signal recovers during the sub-sequence $S_{MRS}$ to a level that is already strong enough to serve as a reference signal. Also toward this end, in some embodiments there is no spoiler gradient interposed between the end of the MRS sub-sequence $S_{MRS}$ and the start of the MR reference sub-sequence $S_{Ref}$.

In some embodiments the MR reference sub-sequence $S_{Ref}$ has the same period of $S_{MRS}$, and is constructed to limit its impact on the recovery of MRS signal in Z-direction between the end of useful MRS acquisition and the start of the next repetition time (TR). Toward this end, the excitation pulse (denoted herein as γ) for the MR reference sub-sequence $S_{Ref}$ is made small. In some embodiments the excitation pulse γ for the MR reference sub-sequence $S_{Ref}$ has a flip angle of 5° or less. In some embodiments the excitation pulse γ has a flip angle of 3° or less. It is disclosed herein that using these design principles the MR sequence 14 can have about 90% of the signal-to-noise ratio (SNR) of approaches employing larger flip angles for the reference scan, while keeping TR for the complete MR sequence 14 (including the MR reference sub-sequence $S_{Ref}$) as short as 2000 msec, which is 50% shorter than methods using a larger flip angle for the reference scan. The acquisition speed gain is achieved by use of the low flip angle for the excitation pulse γ (e.g., less than or equal to 5°, and more preferably less than or equal to) 3°.

The combination of (1) a minimal delay between the end of the MRS sub-sequence $S_{MRS}$ and the start of the MR reference sub-sequence $S_{Ref}$, and (2) the low flip angle for the excitation pulse γ for the MR reference sub-sequence $S_{Ref}$, advantageously provides more accurate phase and B0 correction. The time over which the B0 field can drift is minimized.

For SV scan, the zero order and linear phase distortion of the water reference signal is calculated and used to do phase correction to the data from second part for each TR period. For a chemical shift imaging (CSI) scan, the processing suitably starts after the scan finishes, at which time the reference data is processed by a fast Fourier transform (FFT) in spatial dimension, and the phase distortion and B0 drift information is calculated for each voxel and used to do phase and B0 correction to the data from second part of the same voxel. Data procession is automatic and results are suitably saved to a system DICOM (Digital Imaging and Communications in Medicine) image data base for further use.

Figure 3:
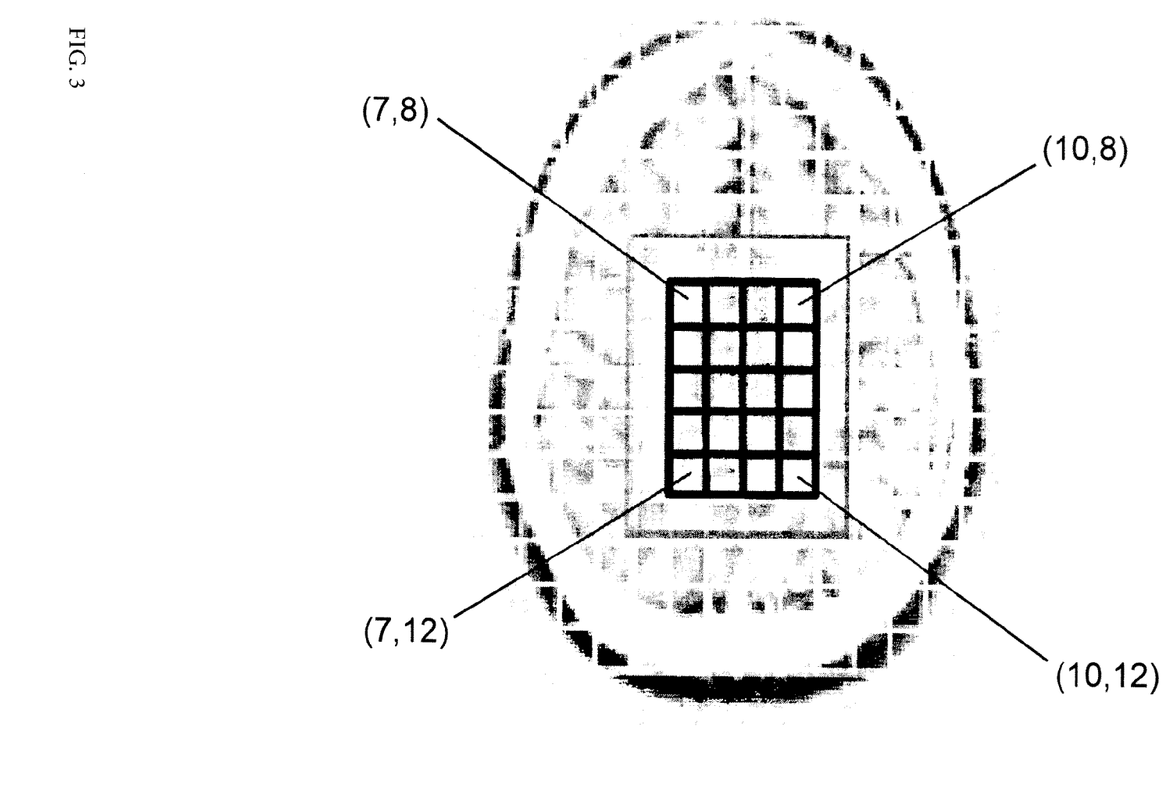
FIG. 3 diagrammatically shows a brain image with a superimposed 4×5 voxel MRSI grid.
Figure 4:
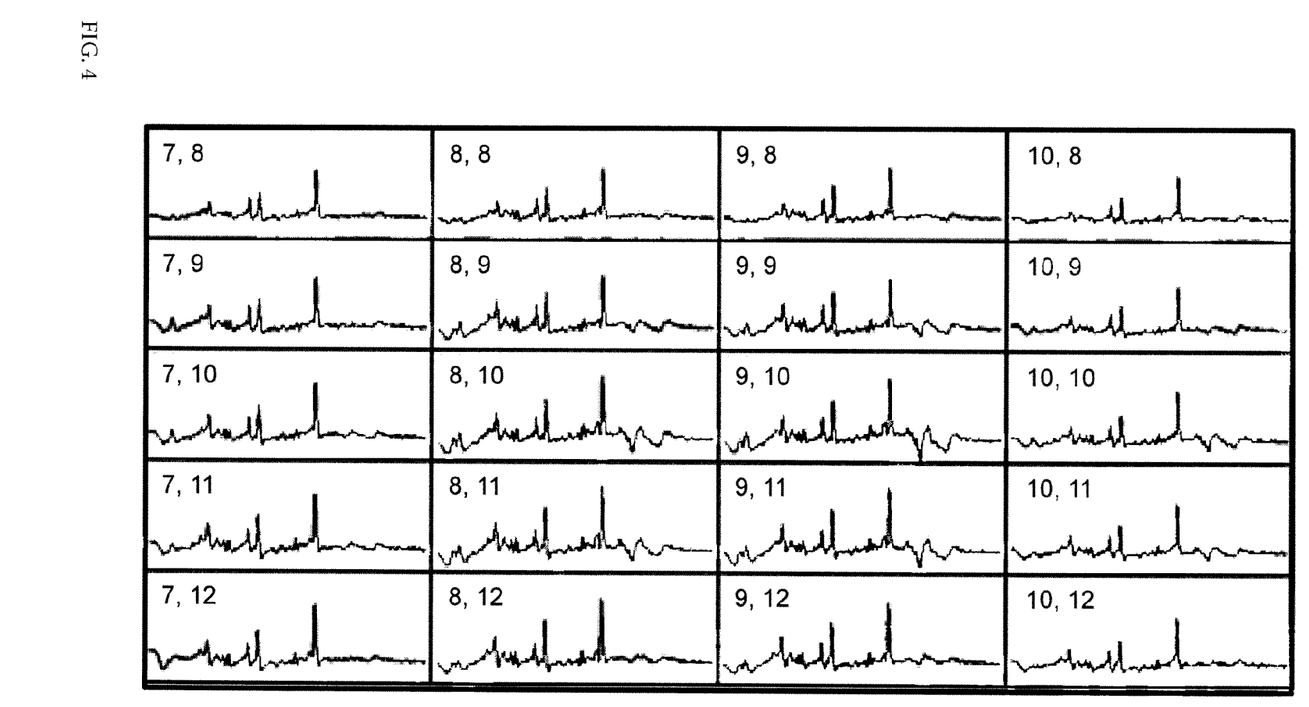
FIG. 4 shows MRS spectra for the twenty voxels of the 4×5 voxel MRSI grid of FIG. 3 with manual phase correction.
Figure 5:
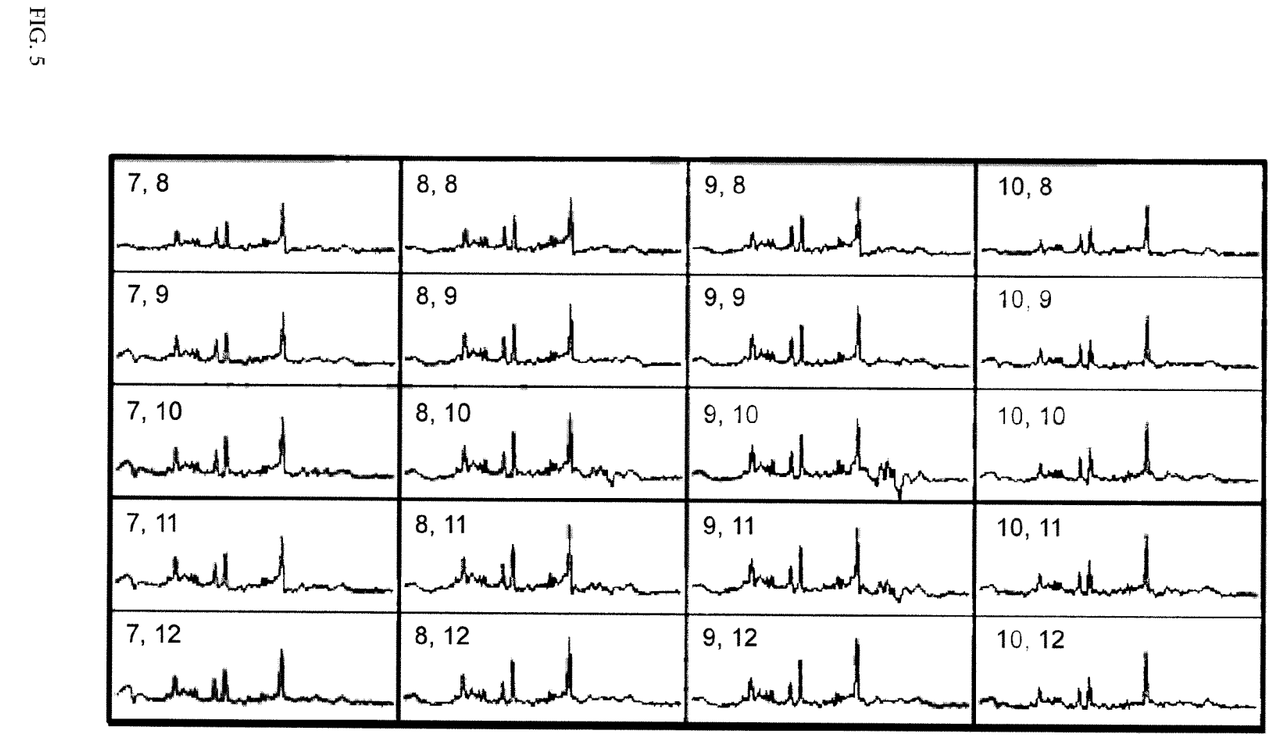
FIG. 5 shows MRS spectra for the twenty voxels of the 4×5 voxel MRSI grid of FIG. 3 with automatic phase and B0 correction as disclosed herein.

With reference to FIGS. 3-5, the disclosed fast MRS sequence was implemented in actual brain MRSI. PRESS CSI data were acquired of a human volunteer using the following scan parameters: TR=2000 msec, TE=38 msec, using an eight channel phase-array head coil and a 3.0T Philips Achieva™ system. FIG. 3 shows the location of the VOI and the acquired 4×5 voxel CSI matrix. FIG. 4 shows the CSI data without reference scan, after manual phasing. Some degree of phase distortion remains, which was not corrected for some voxels. FIG. 5 shows the result for the scan of PRESS sequence with interleaved navigator scan (that is, the MRS scan 14 of FIG. 2). No further procession was used for this data. In FIGS. 4 and 5, CSI matrix voxel identifications are labeled in the upper right of each spectrum. In FIG. 3, only the voxels at the upper left (7,8), upper right (10,8), lower left (7,12), and lower right (10,12) are labeled.

The illustrative embodiments relate to $^1$H MRS, in which the dominant water signal is suppressed to provide more accurate non-water spectra. More generally, the disclosed approaches can be employed for other types of MRS in which a dominant signal source is suppressed.

This application has described one or more preferred embodiments. Modifications and alterations may occur to others upon reading and understanding the preceding detailed description. It is intended that the application be construed as including all such modifications and alterations insofar as they come within the scope of the appended claims or the equivalents thereof.

Having thus described the preferred embodiments, the invention is now claimed to be:

1. A method comprising:
    performing a magnetic resonance (MR) sequence including:
        applying a preparatory MR sub-sequence providing water signal suppression;
        performing a magnetic resonance spectroscopy (MRS) sub-sequence after applying the preparatory MR sub-sequence to acquire $^1$H MRS data with water signal suppression;
        performing an MR reference sub-sequence after the MRS sub-sequence to acquire MR reference data wherein an excitation pulse for the MR reference sub-sequence has a flip angle of 5° or less; and
        performing phase and B0 correction of the $^1$H MRS data with water signal suppression using the MR reference data to generate corrected MRS data.

2. The method of claim 1 wherein the MR sequence is performed with a repetition time less than or equal to 2000 msec.

3. The method of claim 1 wherein the MR sequence is performed with a repetition time less than or equal to 1500 msec.

4. The method of claim 1 wherein the combination of the MRS sub-sequence and the MR reference sub-sequence is performed over a time interval less than or equal to 1000 msec.

5. The method of claim 1 wherein the MR reference sub-sequence is performed over a time interval less than or equal to 500 msec.

6. The method of claim 1 wherein the MRS sub-sequence is performed over a time interval less than or equal to 500 msec.

7. The method of claim 1 wherein the excitation pulse for the MR reference sub-sequence has a flip angle of 3° or less.

8. The method of claim 1 wherein no time delay is interposed between the end of the MRS sub-sequence and the excitation pulse of the MR reference sub-sequence.

9. The method of claim 1 wherein the MR sequence includes spatial encoding magnetic field gradient pulses to generate the MRS data as magnetic resonance spectroscopic imaging (MRSI) data, and the method further includes displaying the corrected MRS data on a display device as an MRSI image.

10. The method of claim 1 further including displaying the corrected MRS data on a display device as an MRS spectrum.

11. The method of claim 1 wherein the MR sequence is performed by an MR scanner and the phase and B0 correction is performed by a digital processor.

12. An apparatus comprising:
a magnetic resonance (MR) controller configured to cause an MR scanner to perform an MR sequence including:
applying a preparatory MR sub-sequence providing water signal suppression,
performing a magnetic resonance spectroscopy (MRS) sub-sequence after applying the preparatory MR sub-sequence to acquire MRS data with water signal suppression, and
performing an MR reference sub-sequence after the MRS sub-sequence to acquire MR reference data;
wherein the MR sequence has a repetition time of 2000 msec or less; and
wherein an excitation pulse of the MR reference sub-sequence has a flip angle of 5° or less.

13. The apparatus of claim 12 wherein the MR sequence has a repetition time less than or equal to 1500 msec.

14. The apparatus of claim 12 wherein the combination of performing the MRS sub-sequence and performing the MR reference sub-sequence occupies a time interval less than or equal to 1000 msec.

15. The apparatus of claim 12 wherein the performing of the MR reference sub-sequence occupies less than or equal to 500 msec.

16. The apparatus of claim 12 wherein the excitation pulse of the MR reference sub-sequence has a flip angle of 3 degrees or less.

17. The apparatus of claim 12 further comprising: an MRS data processing module configured to perform phase and B0 correction of the MRS data with water signal suppression using the MR reference data to generate corrected MRS data.

18. A non-transitory storage medium storing instructions executable by a digital processor to cause a magnetic resonance (MR) scanner to perform an MR sequence including:
applying a preparatory MR sub-sequence providing suppression of MR signal from a dominant signal source,
performing a magnetic resonance spectroscopy (MRS) sub-sequence after applying the preparatory MR sub-sequence to acquire MRS data with suppression of MR signal from the dominant signal source, and
performing an MR reference sub-sequence to acquire MR reference data, the MR reference sub-sequence being performed after the MRS sub-sequence and while the preparatory MR sub-sequence continues to provide some suppression of MR signal from the dominant signal source, an excitation pulse of the MR reference sub-sequence having a flip angle of 5° or less.

19. The non-transitory storage medium of claim 18 wherein the dominant signal source is water.

20. The non-transitory storage medium of claim 18, wherein the MR sequence further includes:
performing phase and B0 correction of the $^1$H MRS data with water signal suppression using the MR reference data to generate corrected MRS data.

* * * * *